(12) United States Patent
Takahashi

(10) Patent No.: US 12,166,426 B2
(45) Date of Patent: Dec. 10, 2024

(54) POWER CONVERTER

(71) Applicant: DENSO CORPORATION, Kariya (JP)

(72) Inventor: Nobuaki Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 192 days.

(21) Appl. No.: 17/831,589

(22) Filed: Jun. 3, 2022

(65) Prior Publication Data

US 2022/0294360 A1 Sep. 15, 2022

Related U.S. Application Data

(63) Continuation of application No. PCT/JP2020/046062, filed on Dec. 10, 2020.

(30) Foreign Application Priority Data

Feb. 5, 2020 (JP) ................. 2020-018238

(51) Int. Cl.
*H02M 7/00* (2006.01)
*H05K 7/14* (2006.01)
*H02M 7/537* (2006.01)

(52) U.S. Cl.
CPC ........ *H02M 7/003* (2013.01); *H05K 7/14329* (2022.08); *H02M 7/537* (2013.01); *H05K 7/1432* (2013.01)

(58) Field of Classification Search
CPC .... H02M 7/003; H02M 7/537; H05K 5/0056; H05K 5/064; H05K 5/065; H05K 7/1432; H05K 7/14322; H05K 7/14329; H05K 7/20463; H05K 7/209
See application file for complete search history.

(56) References Cited

U.S. PATENT DOCUMENTS

| | | | |
|---|---|---|---|
| 2013/0134775 A1* | 5/2013 | Tomokage | B60K 1/00 307/9.1 |
| 2013/0265808 A1* | 10/2013 | Ishii | H02M 1/12 363/97 |
| 2014/0015314 A1* | 1/2014 | Shiba | H05K 7/14329 307/9.1 |
| 2016/0106011 A1 | 4/2016 | Mizuno | |
| 2018/0013355 A1* | 1/2018 | Tokuyama | H01L 25/18 |
| 2020/0118753 A1* | 4/2020 | Nishimura | H01G 4/33 |
| 2022/0166311 A1* | 5/2022 | Kiuchi | H05K 5/0217 |

\* cited by examiner

*Primary Examiner* — Fred E Finch, III
(74) *Attorney, Agent, or Firm* — Oliff PLC

(57) ABSTRACT

The power converter includes a capacitor connected to a power conversion unit, and a busbar module having a busbar covered with a molded insulating resin. The busbar module includes a fixed portion provided integrally with the busbar module and fixed to a casing by a fastener. The fixed portion has a shape protruding toward the capacitor from the busbar when the busbar module and the capacitor are viewed in a height direction. The fixed portion is located between the busbar and the capacitor unit.

11 Claims, 2 Drawing Sheets

POWER CONVERTER

CROSS REFERENCE TO RELATED APPLICATIONS

The present application is a continuation application of International Patent Application No. PCT/JP2020/046062 filed on Dec. 10, 2020, which designated the U.S. and claims the benefit of priority from Japanese Patent Application No. 2020-018238 filed on Feb. 5, 2020, the disclosure of which is incorporated herein by reference.

TECHNICAL FIELD

The present disclosure relates to a power converter.

BACKGROUND

A power converter includes a busbar arranged in proximity to a capacitor.

SUMMARY

According to at least one embodiment of the disclosure, a power converter includes a power conversion unit, a capacitor, a busbar module, and a casing. The power conversion unit performs power conversion and supplies an electric current to a load. The capacitor is connected to the power conversion unit. The busbar module has a busbar through which an electric current flows, and the busbar is covered with a molded insulating resin. The casing houses the power conversion unit, the capacitor and the busbar module. The busbar module includes a fixed portion integrated with the busbar module and fixed to the casing by a fastener. The fixed portion has a shape protruding toward the capacitor from the busbar and is located between the busbar and the capacitor when the busbar module and the capacitor are viewed in a height direction.

BRIEF DESCRIPTION OF DRAWINGS

The details of one or more embodiments are set forth in the accompanying drawings and the description below. Other features and advantages will be apparent from the description and drawings, and from the claims.

DETAILED DESCRIPTION

Figure 1:
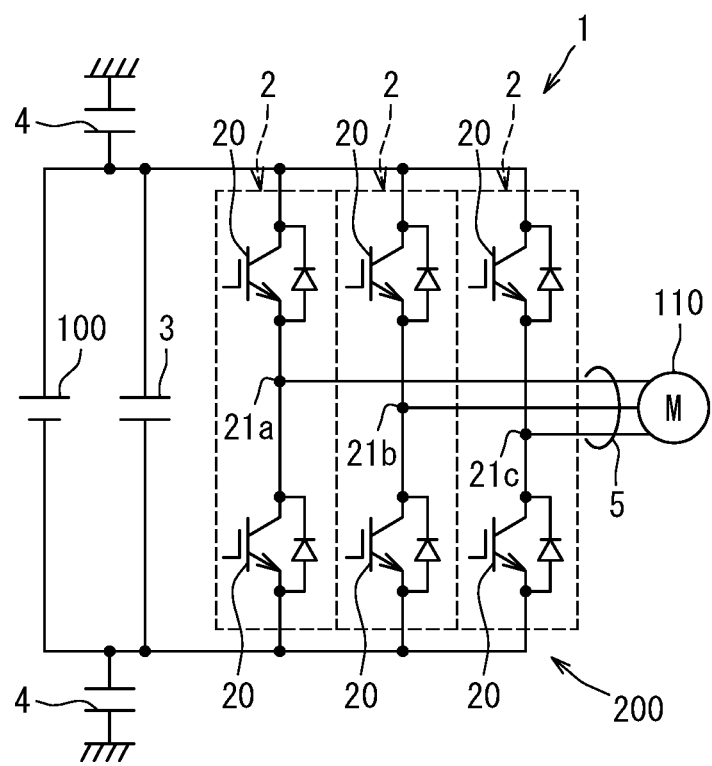
FIG. 1 is a circuit diagram of a power converter according to a first embodiment.

A power converter according to a comparative example includes a busbar arranged in proximity to a capacitor. The capacitor can receive heat from the busbar.

According to one aspect of the disclosure, a power converter performs power conversion. The power converter includes a power conversion unit that supplies an electric current to a load, and a capacitor connected to the power conversion unit, a busbar module having a busbar allowing the electric current to flow therethrough and being covered with a molded insulating resin, and a casing housing the power conversion unit, the capacitor and the busbar module. The busbar module includes the fixed portion integrally provided with the busbar module and fixed to the casing by a fastener. The fixed portion has a shape protruding from the busbar toward the capacitor and is positioned between the busbar and the capacitor when the busbar module and the capacitor are viewed in a height direction.

According to this power converter, the busbar module includes the fixed portion protruding toward the capacitor from the busbar that generates a large amount of heat due to the electric current. When the busbar module and the capacitor are viewed in the height direction, the fixed portion is located between the busbar and the capacitor. Therefore, the busbar is provided at a position apart from the capacitor by at least a size of the fixed portion. Thus, the power converter has a configuration in which heat released from the busbar is unlikely to transfer to the capacitor. As a result, the power converter that reduces a thermal influence of the heat released from the busbar on the capacitor can be provided.

Hereinafter, embodiments for implementing the present disclosure will be described referring to drawings. In each embodiment, portions corresponding to the elements described in the preceding embodiments are assigned the same reference numerals, and redundant explanation thereof may be omitted. When only a part of a configuration is described in an embodiment, the other preceding embodiments can be applied to the other parts of the configuration. It may be possible not only to combine parts which are explicitly described in the embodiments to be able to be combined specifically, but also to partially combine the embodiments without such explicit description unless there is a problem with the combination.

First Embodiment

A first embodiment showing an example of a power converter will be described with reference to FIGS. 1 to 3. The power converter can be applied to an in-vehicle power conversion device mounted on a vehicle such as an electric vehicle or a hybrid vehicle. The power converter can be applied to, for example, an inverter device, or a converter device. The power converter may be, for example, a power supply device that receives an AC (i.e. alternating current) input and generates a DC (i.e. direct current) output, a power supply device that receives a DC input and generates a DC output, or a power supply device that receives an AC input and generates an AC output. In the present embodiment, the power converter is applied to, for example, an inverter device and will be described below.

The power converter 1 includes an inverter circuit 200. As shown in FIG. 1, the inverter circuit 200 includes semiconductor modules 2 that form a power conversion unit. The semiconductor modules 2 include semiconductor elements 20 (e.g. insulated-gate bipolar transistor elements). By switching the semiconductor elements 20, the inverter circuit 200 converts DC power supplied from a DC power supply 100 into AC power. The vehicle runs by driving a three-phase AC motor 110 using the obtained AC power.

The DC power supply 100 is, for example, secondary batteries. The secondary batteries may employ a lithium ion secondary battery, a nickel hydrogen secondary battery, and an organic radical battery, for example. The power converter 1 includes three-phase legs connected in parallel between a P busbar connected to a positive electrode of the DC power supply 100 and an N busbar connected to a negative electrode of the DC power supply 100. The leg of each phase includes semiconductor elements 20 connected in series between the P busbar and the N busbar.

The inverter circuit 200 includes three upper and lower arm circuits that each includes two arms connected in series.

An input side of the inverter circuit 200 is connected to a smoothing capacitor 3, and an output side of the inverter circuit 200 is connected to a three-phase AC motor 110 as a load. The three upper and lower arm circuits correspond to, for example, U-phase, V-phase, and W-phase, respectively, and are arranged in this order from the smoothing capacitor 3. A higher potential one of each of the upper and lower arm circuits may be referred to as an upper arm. A lower potential one of each of the upper and lower arm circuits may be referred to as a lower arm.

A current sensor 5 detects output currents of the arms. The current sensor 5 outputs electric signals corresponding to the output currents of the arms to a controller. This electrical signals are feedback signals. The feedback signals are signals corresponding to an output current.

The power converter 1 includes busbars including input busbars and output busbars. The power converter 1 includes busbars for both power input and power output. The busbars in the power converter 1 include a conductive member to be connected to an input terminal and a conductive member to be connected to an output terminal. The busbars are each a conductive member connected to an input side or an output side of at least one of elements including the semiconductor modules 2 and the capacitor. Since such busbars each form one of electric power paths and generate heat, the busbars release heat to peripheral parts. The input busbars are, for example, the P busbar and the N busbar.

The output busbars are, for example, busbars provided on electric power paths through which the output currents of the arms flow to the three-phase AC motor 110. The current sensor 5 detects the output currents flowing through the output busbars. One of the output busbars is provided on an electric power path that connects a connection portion 21a between the upper arm and the lower arm in the U-phase to a winding of the three-phase AC motor 110. One of the output busbars is provided on an electric power path that connects a connection portion 21b between the upper arm and the lower arm in the V-phase to a winding of the three-phase AC motor 110. One of the output busbars is provided on an electric power path that connects a connection portion 21c between the upper arm and the lower arm in the W-phase to a winding of the three-phase AC motor 110.

The power converter 1 includes a casing 10 housing electric components. The power converter 1 includes a first capacitor unit 30 housed in the casing 10. The capacitor unit 30 includes at least the smoothing capacitor 3 and Y capacitors 4. The smoothing capacitor 3 is connected in parallel with the semiconductor modules 2. One of the Y capacitors 4 is connected to a positive electrode wire and is connected to the ground. One of the Y capacitors 4 is connected to a negative electrode wire and is connected to the ground. In the vehicle, the Y capacitors 4 are electrically connected to a body ground such as a chassis via a casing ground of the power converter 1.

The casing 10 houses the semiconductor modules 2, the smoothing capacitor 3, the Y capacitors 4, the current sensor 5, and a control circuit board, for example. The semiconductor modules 2 are examples of the power conversion unit that performs power conversion and supplies current to the load. The smoothing capacitor 3 is electrically connected to the semiconductor modules 2. The smoothing capacitor 3 and the Y capacitors 4 are integrally formed as the capacitor unit 30 and are fixed in the casing 10.

An internal space of the casing 10 is divided by a partition wall into a capacitor housing space and a semiconductor-module housing space, for example. The semiconductor-module housing space houses the control circuit board in addition to the semiconductor modules 2.

The semiconductor modules 2 each include a body portion in which the semiconductor elements 20 are incorporated, a power terminal and a control terminal protruding from the body portion. The semiconductor modules 2 are also called power modules. The power terminal includes an input terminal to which a DC voltage is applied, and an output terminal connected to one of the output busbars leading to the three-phase AC motor 110. The input terminal is connected to a terminal of the capacitor and is electrically connected to an output unit of the DC power supply 100 via one of the input busbars. The control terminal is connected to the control circuit board. The control circuit board forms a circuit board on which electronic components such as arithmetic elements that control operations of the semiconductor elements 20 are mounted. On/off operations of the semiconductor elements 20 are controlled by the control circuit board. By this control, a DC power supplied from the DC power supply 100 is converted into an AC power. The control circuit board is electrically connected via a wire to a connector protruding outward from the casing 10. This connector is connectable to peripheral devices installed outside the power converter 1.

The capacitor unit 30 incorporates the smoothing capacitor 3 and the Y capacitors 4. The smoothing capacitor 3 and the Y capacitors 4 are encapsulated in a resin while terminals are exposed from the resin to be connected to other electric components. The encapsulating resin is made of a thermosetting resin such as an epoxy resin. A gap between each capacitor, which has a capacitor element and terminals, and a housing portion for the capacitor is filled with the encapsulating resin. According to this configuration, the encapsulating resin seals the capacitor element and the terminals, for example. A part of the terminals or the like protrudes from the encapsulating resin. The capacitor unit 30 is fixed to, for example, a support base by a fastener such as a bolt, a screw, or a rivet, or a coupling method such as welding or brazing. The support base is integrated with the casing 10 or fixed to the casing 10. Hereinafter, the smoothing capacitor 3 and the Y capacitors 4 may be collectively referred to as capacitor.

The casing 10 forms one container. The casing 10 is formed of a combination of case members. The casing 10 consists of the case members. The casing 10 includes a first case member and a second case member, for example. The first case member and the second case member are resin molded products containing a resin material. For example, the first case member is a lower case that surrounds a component including the busbar module 6 among the electrical components. The casing 10 supports the busbar module 6 so that the busbar module 6 does not move in the casing 10. The busbar module 6 is fixed to the first case member. For example, the second case member is an upper case attached to the lower case so as to cover an internal space of the lower case.

The second case member integrally includes, for example, a top wall, a lateral wall erected from a peripheral edge of the top wall, and a joint. The top wall of the second case member corresponds to a ceiling of the casing 10. The top wall is located above and covers the semiconductor modules 2, the current sensor 5, and the control circuit board, for example. The first case member integrally includes, for example, a bottom wall, a lateral wall erected from a peripheral edge of the bottom wall, and a joint. The joints of the first case member and the second case member are joined to each other to form the casing. The bottom wall of the first case member corresponds to a bottom of the casing 10, and the busbar module 6 is mounted on the bottom wall.

The casing 10 includes an attached portion which is attached to an installation member of the vehicle. The installation member is one of members of the vehicle such as a vehicle chassis, a vehicle body, or a member mounted on the vehicle. The installation member is one of the members of the vehicle which is a functional component such as a motor device mounted on the vehicle. The attached portion and the installation member are coupled by a fastener such as a bolt or a screw.

Figure 2:
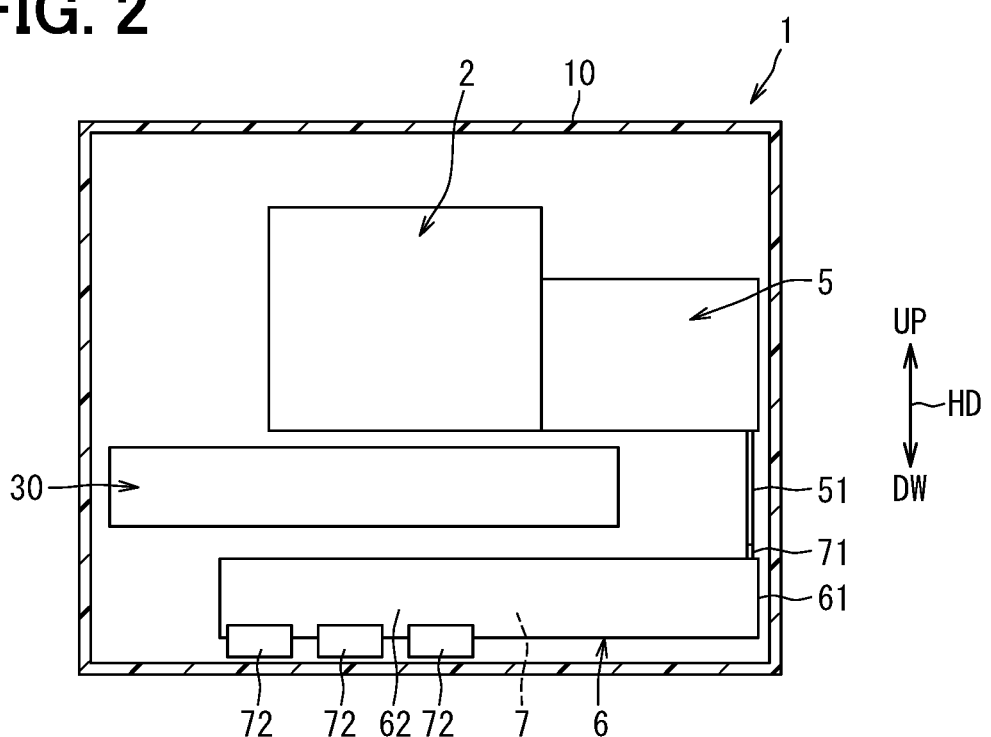
FIG. 2 is a diagram illustrating a schematic configuration of the power converter according to the first embodiment.

As shown in FIG. 2, the busbar module 6 is placed at a position lower in a height direction (HD) than the capacitor unit 30, the semiconductor modules 2, and the current sensor 5. Further, the busbar module 6 at the height position does not overlap the capacitor unit 30 in a direction orthogonal to the height direction. The busbar module 6 at the height position does not overlap the current sensor 5 in the direction orthogonal to the height direction. Further, the capacitor unit 30 is placed at a height position so as not to overlap the semiconductor modules 2 and the current sensor 5 in the direction orthogonal to the height direction. The capacitor unit 30 is placed at the position lower in the height direction than the semiconductor modules 2 and the current sensor 5.

The busbar module 6 includes a busbar 7 which is the output busbar or the input busbar, and a resin portion incorporating the busbar 7. The busbar module 6 includes a fixed portion integrated with the resin portion of the busbar module 6. The fixed portion is made of the same material as a material of the resin portion. The fixed portion is fixed to the casing 10 by a fastening force of a fastener 8 such as a bolt or a screw. The resin portion contains, for example, a resin having an insulating property. The resin portion seals the busbar 7 except for terminals used for electrical connection. The terminals protrude outward from the resin portion. The busbar 7 is provided in the busbar module 6 by being inserted into a mold of the busbar module 6 and integrally molded with the resin portion via solidification of a resin surrounding the busbar 7.

The busbar module 6 includes a first molded resin 61, a second mold resin 62 having a shape intersecting with the first molded resin 61, and a connecting portion 63. The first molded resin 61 has a shape extending along a lateral wall 30*a* of the capacitor unit 30 adjacent to the Y capacitors 4. For example, as shown in FIG. 3, the current sensor 5 overlaps both the first molded resin 61 and the Y capacitors 4 in the height direction. In order to suppress an influence of heat, the current sensor 5 may not overlap the busbar 7 in the height direction. The first molded resin 61 incorporates a part of the busbar 7 via resin molding such that first terminals 71 of the bus bar 7 are exposed to an outside of the first molded resin 61. In an example shown in FIG. 2, the first terminals 71 are connected to terminals of the current sensor 5 through busbars 51 extending in the height direction. The first terminals 71 are input terminals through which an electric power output from the power conversion unit is input to the busbar module 6. The first terminals 71 are input terminals of current paths forming the respective three phases consisting of the U-phase, the V-phase, and the W-phase.

The second mold resin 62 is orthogonal to the first molded resin 61 and extends along a lateral wall 30*b* of the capacitor unit 30 along which the Y capacitors 4 and the smoothing capacitor 3 are arranged. The second molded resin 62 incorporates a part of the busbar 7 via resin molding such that second terminals 72 of the bus bar 7 are exposed to an outside of the second molded resin 62. The second terminals 72 are output terminals through which a current is outputted to the three-phase AC motor 110 from the busbar module 6. The second terminals 72 are output terminals of the current paths forming the respective three phases consisting of the U-phase, the V-phase, and the W-phase. The connecting portion 63 incorporates a busbar that connects the busbar in the first molded resin 61 and the busbar in the second mold resin 62. The busbar 7 includes three busbars that extend along the molded resins and are arranged in a direction orthogonal to the extending directions of the busbars.

The busbar module 6 has an L shape along an outer peripheral edge of the capacitor unit 30 when the busbar module 6 and the capacitor are viewed in the height direction. According to this shape, a center of gravity of the busbar module 6 is located at a position closer to the capacitor than to the first molded resin 61, the second molded resin 62, and the connecting portion 63. Therefore, because of a weight balance of the busbar module 61, it is most stable to support the busbar module 6 at the position of the center of gravity within a capacitor-side area (CS) from the connecting portion 63 toward the capacitor.

Figure 3:
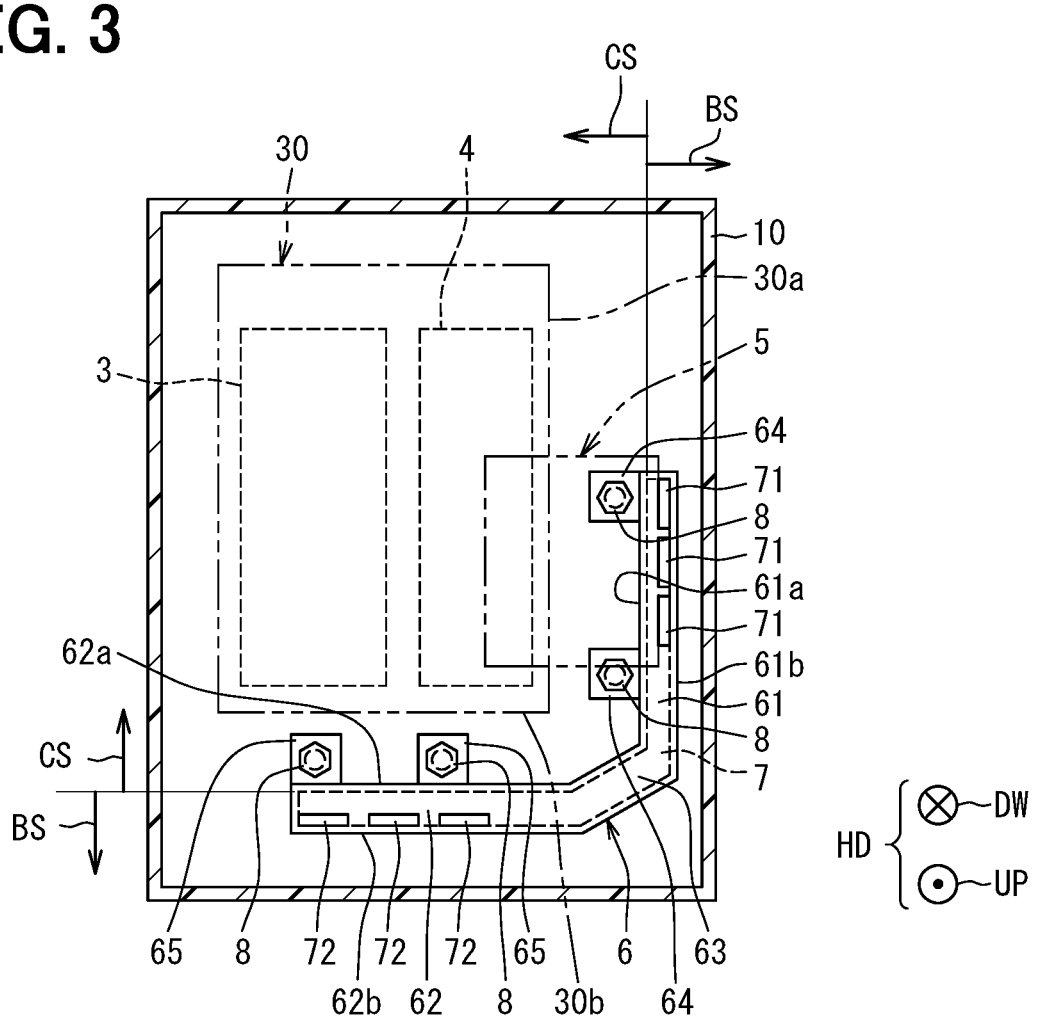
FIG. 3 is a diagram illustrating a positional relationship between a busbar and peripheral devices.

FIG. 3 shows the positions of components when the busbar module 6 and the capacitor are viewed in the height direction (HD). In order to explain a positional relationship relative to the busbar module 6, the capacitor unit 30 and the current sensor 5 are shown by an alternate long and two short dashes line, and the smoothing capacitor 3 and the Y capacitors 4 are shown by a dash line in FIG. 3. In FIG. 3, the capacitor-side area (CS) indicates an area from a portion of the busbar 7 incorporated in the first molded resin 61 toward the capacitor. In FIG. 3, the capacitor-side area indicates an area from a portion of the busbar 7 incorporated in the second mold resin 62 toward the capacitor.

The fixed portion of the busbar module 6 includes a first fixed portion 64 and a second fixed portion 65. As shown in FIG. 3, an outer peripheral edge of the busbar module 6 includes opposite-side edges 61*b*, 62*b* located in a busbar-side area (BS) opposite from the capacitor-side area. The fixed portion may not provided on the opposite-side edges 61*b*, 62*b*.

The first fixed portion 64 has a shape that protrudes toward the capacitor from the busbar 7 when the busbar module 6 and the capacitor are viewed in the height direction. The first fixed portion 64 is provided on a capacitor-side edge 61*a* of the first molded resin 61 that faces the capacitor. The first fixed portion 64 provided on the first molded resin 61 is one first fixed portion or one of first fixed portions. The first fixed portion 64 is located between the busbar 7 and the capacitor when the busbar module 6 and the capacitor are viewed in the height direction. According to this configuration, the portion of the busbar 7 incorporated in the first molded resin 61 is apart from the capacitor by at least a size of the first fixed portion 64.

The second fixed portion 65 has a shape that protrudes toward the capacitor from the busbar 7 when the busbar module 6 and the capacitor are viewed in the height direction. The second fixed portion 65 is provided on a capacitor-side edge 62*a* of the second molded resin 62 that faces the capacitor. The second fixed portion 65 provided on the second molded resin 62 is one first fixed portion or one of first fixed portions. The second fixed portion 65 is located between the busbar 7 and the capacitor when the busbar module 6 and the capacitor are viewed in the height direction. According to this configuration, the portion of the busbar 7 incorporated in the second molded resin 62 is apart from the capacitor by at least a size of the second fixed portion 65.

The casing 10 has a hole or recess having an inner diameter slightly smaller than an outer diameter of a shaft of the fastener 8 at positions corresponding to the first fixed portion 64 and the second fixed portion 65. This hole or recess is a pilot hole for the fastener 8. A female screw is formed in the hole or recess by screwing a male screw formed on the shaft of the fastener 8. Further, the casing 10 may have a female screw at positions corresponding to the first fixed portion 64 and the second fixed portion 65. The female screw is formed so that the male screw formed on the shaft of the fastener 8 can be screwed into the female screw. The casing 10, the first fixed portion 64 and the second fixed portion 65 are connected by inserting the fastener 8 into each of the fixed portions and screwing the male screw of the fastener 8 into the female screw of the casing 10.

Actions and effects produced by the power converter 1 according to the first embodiment will be described. The power converter 1 includes the power conversion unit, the capacitor connected to the power conversion unit, and the busbar module 6 having the busbar 7 covered with a molded insulating resin. The power converter 1 includes the casing 10 that houses the power conversion unit, the capacitor, and the busbar module 6. The busbar module 6 includes the fixed portion integrated with the busbar module 6 and fixed to the casing 10 by the fastener 8. The fixed portion has a shape that protrudes toward the capacitor from the busbar 7 when the busbar module 6 and the capacitor are viewed in the height direction. The fixed portion is located between the busbar 7 and the capacitor.

According to this power converter 1, the busbar module 6 includes the fixed portion protruding toward the capacitor from the busbar 7 that generates a large amount of heat due to an electric current. When the busbar module 6 and the capacitor are viewed in the height direction, the fixed portion is located between the busbar 7 and the capacitor. Therefore, the busbar 7 is provided at a position apart from the capacitor by at least a size of the fixed portion. Thus, the power converter 1 has a configuration in which heat released from the busbar 7 is difficult to transfer to the capacitor. In this way, the power converter 1 is capable of reducing a thermal influence of the heat released from the busbar 7 on the capacitor.

The fixed portion is not provided on the opposite-side edges 61b, 62b of the outer peripheral edge of the busbar module 6 facing away from the capacitor when the busbar module 6 and the capacitor are viewed in the height direction. The fixed portion is provided on the capacitor-side edges 61a, 62a facing the capacitor. According to this configuration, the busbar module 6 can be placed at a position away from the capacitor by a space required for the fixed portion provided on the capacitor-side edges 61a, 62a. As a result, a distance between the busbar 7 and the capacitor can be further increased, and thus the power converter 1 difficult to transfer heat released from the busbar 7 to the capacitor can be provided.

The busbar 7 of the busbar module 6 includes the three busbars that connect the power conversion unit, respectively, to the windings of the phases of the three-phase AC motor 110 that is the load. The three busbars inside the busbar module 6 are arranged side by side in a direction in which the fixed portion protrudes toward the capacitor. According to this configuration, the busbars located on an output side and connecting the three-phase AC motor 110 and an output of the power conversion unit can be placed away from the capacitor. Therefore, the power converter 1 that reduces heat transfer from the busbar on the output side to the capacitor can be provided.

The busbar module 6 includes the first molded resin 61 from which the first terminal 71 is exposed to the outside of the busbar module 6, the second mold resin 62 from which the second terminal 72 is exposed to the outside, and the connecting portion 63 connecting the first molded resin 61 and the second mold resin 62. The second mold resin 62 extends in a direction intersecting the extending direction of the first molded resin 61. The center of gravity of the busbar module 6 is located at a position closer to the capacitor than to the first molded resin 61, the second molded resin 62, and the connecting portion 63.

According to this configuration, the first molded resin 61 and the second mold resin 62 extend so as to intersect each other and are connected by the connecting portion 63. Further, since the center of gravity of the busbar module 6 is located in an area from the busbar module 6 toward the capacitor where the fixed portion is located. Thus, an effect of reducing vibration of the busbar module 6 is high. Therefore, when the power converter 1 is mounted on a movable body such as the vehicle, the busbar module 6 can reduce vibration resonance.

The busbar module 6 is formed to include the first molded resin 61, the second mold resin 62 and the connecting portion 63. The fixed portion includes the first fixed portion 64 and the second fixed portion 65. The first fixed portion 64 is located between the portion of the busbar incorporated in the first molded resin 61 and the capacitor when the busbar module 6 and the capacitor are viewed in the height direction. The second fixed portion 65 is located between the portion of the busbar incorporated in the second mold resin 62 and the capacitor when the busbar module 6 and the capacitor are viewed in the height direction.

According to this configuration, the portion of the busbar incorporated in the first molded resin 61 is placed at a position apart from the capacitor by at least a size of the first fixed portion 64. Further, the portion of the busbar incorporated in the second molded resin 62 is placed at a position apart from the capacitor by at least a size of the second fixed portion 65. Therefore, the busbar 7 of the busbar module 6 can be apart from the capacitor in both the first molded resin 61 and the second mold resin 62.

The capacitor includes the smoothing capacitor 3 and the Y capacitor 4. The Y capacitor 4 is provided in an area closer to the busbar module 6 than to the smoothing capacitor 3 when the busbar module 6 and the capacitor are viewed in the height direction. According to this configuration, the Y capacitor 4 that is smaller in increase rate of temperature than the smoothing capacitor 3 and has a large temperature difference from a heat resistant temperature can be placed in a thermally severe environment. As a result, the power converter 1 can reduce an amount of heat received by the smoothing capacitor 3 that is more sensitive to heat than the Y capacitor 4.

The Y capacitor 4 is provided in an area that is closer to the busbar module 6 than to the smoothing capacitor 3 and adjacent to both the first molded resin 61 and the second molded resin 62 when the busbar module 6 and the capacitor are viewed in the height direction. According to this, the heat-sensitive smoothing capacitor 3 can be separated from the incorporated portions of the busbar in both the first molded resin 61 and the second mold resin 62. Therefore, the power converter 1 is capable of reducing the amount of heat received by the capacitor.

The capacitor and the busbar module 6 are not overlapped each other in the direction orthogonal to the height direction. According to this configuration, the capacitor and the busbar module 6 are arranged so that their height positions are different and the entire parts of them do not overlap in the direction orthogonal to the height direction. Therefore, the capacitor can be installed away in the height direction from the busbar 7 which is a heat generating portion. Since the capacitor is separated from the busbar 7 in both the protruding direction of the fixed portion and the height direction, the thermal influence of the heat released from the busbar 7 on the capacitor can be further reduced.

Other Embodiments

The disclosure of this specification is not limited to the illustrated embodiment. The disclosure encompasses the illustrated embodiments and variations based on the embodiments by those skilled in the art. For example, the disclosure is not limited to the combinations of components and elements shown in the embodiments, and various modifications and implementations can be performed. The disclosure may be implemented in various combinations. The disclosure may have additional portions that may be added to the embodiments. The disclosure includes the embodiments from which the parts and the components are omitted. The disclosure encompasses the replacement or combination of components, elements between one embodiment and another. The disclosed technical scope is not limited to the description of the embodiment.

The power converter is not limited to the configuration shown in FIG. 2 in terms of the positional relationship between the busbar module 6 and each electric component in the height direction. For example, the busbar module 6 may be installed at a position higher in the height direction than the capacitor unit 30, the semiconductor modules 2, and the current sensor 5.

What is claimed is:

1. A power converter comprising:
a power conversion unit configured to perform power conversion and supply an electric current to a load;
a capacitor connected to the power conversion unit;
a busbar module having a busbar through which an electric current flows, the busbar being covered with a molded insulating resin;
a fastener; and
a casing housing the power conversion unit, the capacitor and the busbar module, wherein
the busbar module includes a fixed portion integrated with the molded insulating resin of the busbar module,
the fastener fixes the fixed portion to the casing to fix the busbar module including the busbar to the casing without the fastener contacting or passing through the busbar, and
the fixed portion has a shape protruding toward the capacitor from the busbar and is located between the busbar and the capacitor when the busbar module and the capacitor are viewed in a height direction.

2. The power converter according to claim 1, wherein
an outer peripheral edge of the busbar module includes an opposite-side edge that faces away from the capacitor, and a capacitor-side edge that faces the capacitor, and
the fixed portion is provided on the capacitor-side edge without being provided on the opposite-side edge when the busbar module and the capacitor are viewed in the height direction.

3. The power converter according to claim 1, wherein
the busbar is one of three busbars that connect the power conversion unit, respectively, to windings of three phases of a three-phase AC motor that is the load, and the three busbars inside the busbar module are arranged side by side in a direction in which the fixed portion protrudes toward the capacitor.

4. The power converter according to claim 1, wherein
the busbar module includes a first molded resin portion from which a first terminal of the busbar is exposed to an outside of the busbar module, a second molded resin portion from which a second terminal of the busbar is exposed to the outside, and a connecting portion by which the first molded resin portion and the second molded resin portion are connected to each other,
the second molded resin portion extends in a direction intersecting a direction in which the first molded resin portion extends, and
a center of gravity of the busbar module is located at a position closer to the capacitor than to the first molded resin portion, the second molded resin portion, and the connecting portion.

5. The power converter according to claim 4, wherein
the capacitor includes a smoothing capacitor and a Y capacitor, and
the Y capacitor is provided in an area that is closer to the busbar module than to the smoothing capacitor and adjacent to both the first molded resin portion and the second molded resin portion when the busbar module and the capacitor are viewed in the height direction.

6. The power converter according to claim 1, wherein
the busbar module includes a first molded resin portion from which a first terminal of the busbar is exposed to an outside of the busbar module, a second molded resin portion from which a second terminal of the busbar is exposed to the outside, and a connecting portion by which the first molded resin portion and the second molded resin portion are connected to each other,
the second molded resin portion extends in a direction intersecting a direction in which the first molded resin portion extends, and
the fixed portion includes:
a first fixed portion located between the capacitor and a portion of the busbar covered with the first molded resin portion when the busbar module and the capacitor are viewed in the height direction; and
a second fixed portion located between the capacitor and a portion of the busbar covered with the second molded resin portion when the busbar module and the capacitor are viewed in the height direction.

7. The power converter according to claim 1, wherein
the capacitor includes a smoothing capacitor and a Y capacitor, and
the Y capacitor is provided in an area that is closer to the busbar module than to the smoothing capacitor when the busbar module and the capacitor are viewed in the height direction.

8. The power converter according to claim 1, wherein
the capacitor and the busbar module are not overlapped each other in a direction orthogonal to the height direction.

9. The power converter according to claim 1, wherein
the fixed portion is located between the capacitor and a portion of the busbar covered with the molded insulating resin when the busbar module and the capacitor are viewed in the height direction.

10. A power converter comprising:
a power conversion unit configured to perform power conversion and supply an electric current to a load;
a capacitor connected to the power conversion unit;

a busbar module having a busbar through which an electric current flows, the busbar being covered with a molded insulating resin; and a casing housing the power conversion unit, the capacitor and the busbar module, wherein the busbar module includes a fixed portion fixed to the casing by a fastener, the fixed portion has a shape protruding toward the capacitor from the busbar and is located between the busbar and the capacitor when the busbar module and the capacitor are viewed in a height direction, the busbar module includes a first molded resin portion from which a first terminal of the busbar is exposed to an outside of the busbar module, a second molded resin portion from which a second terminal of the busbar is exposed to the outside, and a connecting portion by which the first molded resin portion and the second molded resin portion are connected to each other, the second molded resin portion extends in a direction intersecting a direction in which the first molded resin portion extends, and a center of gravity of the busbar module is located at a position closer to the capacitor than to the first molded resin portion, the second molded resin portion, and the connecting portion.

11. A power converter comprising:

a power conversion unit configured to perform power conversion and supply an electric current to a load;

a capacitor connected to the power conversion unit;

a busbar module having a busbar through which an electric current flows, the busbar being covered with a molded insulating resin; and a casing housing the power conversion unit, the capacitor and the busbar module, wherein the busbar module includes a fixed portion fixed to the casing by a fastener, the fixed portion has a shape protruding toward the capacitor from the busbar and is located between the busbar and the capacitor when the busbar module and the capacitor are viewed in a height direction, the busbar module includes a first molded resin portion from which a first terminal of the busbar is exposed to an outside of the busbar module, a second molded resin portion from which a second terminal of the busbar is exposed to the outside, and a connecting portion by which the first molded resin portion and the second molded resin portion are connected to each other, the second molded resin portion extends in a direction intersecting a direction in which the first molded resin portion extends, and the fixed portion includes:

a first fixed portion located between the capacitor and a portion of the busbar covered with the first molded resin portion when the busbar module and the capacitor are viewed in the height direction; and a second fixed portion located between the capacitor and a portion of the busbar covered with the second molded resin portion when the busbar module and the capacitor are viewed in the height direction.

\* \* \* \* \*